(12) United States Patent
Du (10) Patent No.: US 9,177,890 B2
(45) Date of Patent: Nov. 3, 2015

(54) MONOLITHIC THREE DIMENSIONAL INTEGRATION OF SEMICONDUCTOR INTEGRATED CIRCUITS

(71) Applicant: QUALCOMM Incorporated, San Diego, CA (US)

(72) Inventor: Yang Du, Carlsbad, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 13/788,224

(22) Filed: Mar. 7, 2013

(65) Prior Publication Data

US 2014/0252306 A1 Sep. 11, 2014

(51) Int. Cl.
*H01L 29/06* (2006.01)
*H01L 23/48* (2006.01)
(Continued)

(52) U.S. Cl.
CPC .................. *H01L 23/48* (2013.01); *B82Y 10/00* (2013.01); *H01L 21/76254* (2013.01); *H01L 21/823431* (2013.01); *H01L 21/84* (2013.01); *H01L 21/845* (2013.01); *H01L 27/0688* (2013.01); *H01L 27/0886* (2013.01); *H01L 29/0673* (2013.01);
(Continued)

(58) Field of Classification Search
CPC ................... H01L 2924/0002; H01L 2924/00; H01L 21/823431; H01L 21/823821; H01L 21/84; H01L 23/48; H01L 27/0688; H01L 27/0886; H01L 27/0924; H01L 29/0673; H01L 29/66439; H01L 29/775; B82Y 10/00; B82Y 99/00; Y10S 977/76

USPC ........ 257/9, 24, 355, 335, 278, 659; 438/455, 438/141, 4, 479, 283, 142
See application file for complete search history.

(56) References Cited

U.S. PATENT DOCUMENTS

| 5,606,186 A | 2/1997 | Noda |
| 5,636,125 A | 6/1997 | Rostoker et al. |

(Continued)

FOREIGN PATENT DOCUMENTS

| EP | 1432032 A2 | 6/2004 |
| EP | 2551898 A1 | 1/2013 |

(Continued)

OTHER PUBLICATIONS

Co-pending U.S. Appl. No. 13/784,915, filed Mar. 5, 2013.

(Continued)

*Primary Examiner* — Mohammed Shamsuzzaman
(74) *Attorney, Agent, or Firm* — Muncy, Geissler, Olds & Lowe, P.C.

(57) ABSTRACT

A three-dimensional integrated circuit comprising top tier nanowire transistors formed on a bottom tier of CMOS transistors, with inter-tier vias, intra-tier vias, and metal layers to connect together the various CMOS transistors and nanowire transistors. The top tier first begins as lightly doped regions on a first wafer, with an oxide layer formed over the regions. Hydrogen ion implantation forms a cleavage interface. The first wafer is flipped and oxide bonded to a second wafer having CMOS devices, and the cleavage interface is thermally activated so that a portion of the lightly doped regions remains bonded to the bottom tier. Nanowire transistors are formed in the top tier layer. The sources and drains for the top tier nanowire transistors are formed by in-situ doping during epitaxial growth. After oxide bonding, the remaining process steps are performed at low temperatures so as not to damage the metal interconnects.

4 Claims, 5 Drawing Sheets

(51) Int. Cl.

| | | |
|---|---|---|
| *H01L 29/775* | (2006.01) | |
| *H01L 21/8234* | (2006.01) | |
| *H01L 27/06* | (2006.01) | |
| *H01L 27/088* | (2006.01) | |
| *B82Y 10/00* | (2011.01) | |
| *H01L 21/84* | (2006.01) | |
| *H01L 29/66* | (2006.01) | |
| *H01L 21/762* | (2006.01) | |
| *B82Y 99/00* | (2011.01) | |
| *H01L 21/8238* | (2006.01) | |
| *H01L 27/092* | (2006.01) | |

(52) U.S. Cl.
CPC ........ *H01L 29/66439* (2013.01); *H01L 29/775* (2013.01); *B82Y 99/00* (2013.01); *H01L 21/823821* (2013.01); *H01L 27/0924* (2013.01); *H01L 2924/0002* (2013.01); *Y10S 977/762* (2013.01)

(56) References Cited

U.S. PATENT DOCUMENTS

| | | | |
|---|---|---|---|
| 5,724,557 A | 3/1998 | McBean, Sr. | |
| 6,040,203 A | 3/2000 | Bozso et al. | |
| 6,125,217 A | 9/2000 | Paniccia et al. | |
| 6,260,182 B1 | 7/2001 | Mohan et al. | |
| 6,295,636 B1 | 9/2001 | Dupenloup | |
| 6,305,001 B1 | 10/2001 | Graef | |
| 6,374,200 B1 | 4/2002 | Nakagawa | |
| 6,448,168 B1 | 9/2002 | Rao et al. | |
| 6,627,985 B2 | 9/2003 | Huppenthal et al. | |
| 6,727,530 B1 | 4/2004 | Feng et al. | |
| 6,754,877 B1 | 6/2004 | Srinivasan | |
| 6,834,380 B2 | 12/2004 | Khazei | |
| 6,846,703 B2 | 1/2005 | Shimoda et al. | |
| 6,965,527 B2 | 11/2005 | Fasoli et al. | |
| 6,979,630 B2 | 12/2005 | Walitzki | |
| 7,107,200 B1 | 9/2006 | Korobkov | |
| 7,173,327 B2 | 2/2007 | Siniaguine | |
| 7,209,378 B2 | 4/2007 | Nejad et al. | |
| 7,280,397 B2 | 10/2007 | Scheuerlein | |
| 7,288,418 B2 | 10/2007 | Barge et al. | |
| 7,298,641 B2 | 11/2007 | Madurawe et al. | |
| 7,356,781 B2 | 4/2008 | Koeder et al. | |
| 7,459,716 B2 | 12/2008 | Toda et al. | |
| 7,546,571 B2 | 6/2009 | Mankin et al. | |
| 7,579,654 B2 | 8/2009 | Couillard et al. | |
| 7,622,955 B2 | 11/2009 | Vilangudipitchai et al. | |
| 7,653,884 B2 | 1/2010 | Furnish et al. | |
| 7,663,620 B2 | 2/2010 | Robertson et al. | |
| 7,669,152 B1 | 2/2010 | Tcherniaev et al. | |
| 7,796,092 B2 | 9/2010 | Holly et al. | |
| 7,877,719 B2 | 1/2011 | He | |
| 7,964,916 B2 | 6/2011 | Or-Bach et al. | |
| 7,969,193 B1 | 6/2011 | Wu et al. | |
| 7,989,226 B2 | 8/2011 | Peng | |
| 8,006,212 B2 | 8/2011 | Sinha et al. | |
| 8,026,521 B1 | 9/2011 | Or-Bach et al. | |
| 8,046,727 B2 | 10/2011 | Solomon | |
| 8,059,443 B2 | 11/2011 | McLaren et al. | |
| 8,060,843 B2 | 11/2011 | Wang et al. | |
| 8,114,757 B1 | 2/2012 | Or-Bach et al. | |
| 8,115,511 B2 | 2/2012 | Or-Bach | |
| 8,136,071 B2 | 3/2012 | Solomon | |
| 8,146,032 B2 | 3/2012 | Chen et al. | |
| 8,164,089 B2 | 4/2012 | Wu et al. | |
| 8,208,282 B2 | 6/2012 | Johnson et al. | |
| 8,218,377 B2 | 7/2012 | Tandon et al. | |
| 8,222,696 B2 | 7/2012 | Yamazaki et al. | |
| 8,230,375 B2 | 7/2012 | Madurawe | |
| 8,258,810 B2 | 9/2012 | Or-Bach et al. | |
| 8,298,875 B1* | 10/2012 | Or-Bach et al. | 438/141 |
| 8,332,803 B1 | 12/2012 | Rahman | |
| 8,450,804 B2 | 5/2013 | Sekar et al. | |
| 8,576,000 B2 | 11/2013 | Kim et al. | |
| 8,683,416 B1 | 3/2014 | Trivedi et al. | |
| 8,701,073 B1 | 4/2014 | Fu et al. | |
| 8,803,206 B1* | 8/2014 | Or-Bach et al. | 257/278 |
| 8,803,233 B2* | 8/2014 | Cheng et al. | 257/335 |
| 2004/0036126 A1 | 2/2004 | Chau et al. | |
| 2004/0113207 A1 | 6/2004 | Hsu et al. | |
| 2004/0241958 A1 | 12/2004 | Guarini et al. | |
| 2005/0280061 A1 | 12/2005 | Lee | |
| 2006/0190889 A1 | 8/2006 | Cong et al. | |
| 2007/0040221 A1* | 2/2007 | Gossner et al. | 257/355 |
| 2007/0147157 A1 | 6/2007 | Luo et al. | |
| 2007/0244676 A1 | 10/2007 | Shang et al. | |
| 2008/0276212 A1 | 11/2008 | Albrecht | |
| 2008/0283995 A1 | 11/2008 | Bucki et al. | |
| 2008/0291767 A1 | 11/2008 | Barnes et al. | |
| 2009/0174032 A1 | 7/2009 | Maejima et al. | |
| 2009/0302394 A1* | 12/2009 | Fujita | 257/369 |
| 2010/0115477 A1 | 5/2010 | Albrecht et al. | |
| 2010/0140790 A1 | 6/2010 | Setiadi et al. | |
| 2010/0193770 A1 | 8/2010 | Bangsaruntip et al. | |
| 2010/0229142 A1 | 9/2010 | Masleid et al. | |
| 2010/0276662 A1* | 11/2010 | Colinge | 257/9 |
| 2011/0049594 A1 | 3/2011 | Dyer et al. | |
| 2011/0053332 A1* | 3/2011 | Lee | 438/381 |
| 2011/0059599 A1 | 3/2011 | Ward et al. | |
| 2011/0078222 A1 | 3/2011 | Wegener | |
| 2011/0084314 A1 | 4/2011 | Or-Bach et al. | |
| 2011/0121366 A1 | 5/2011 | Or-Bach et al. | |
| 2011/0215300 A1 | 9/2011 | Guo et al. | |
| 2011/0221502 A1 | 9/2011 | Meijer et al. | |
| 2011/0222332 A1 | 9/2011 | Liaw et al. | |
| 2011/0253982 A1 | 10/2011 | Wang et al. | |
| 2011/0272788 A1 | 11/2011 | Kim et al. | |
| 2011/0280076 A1 | 11/2011 | Samachisa et al. | |
| 2011/0298021 A1 | 12/2011 | Tada et al. | |
| 2012/0012972 A1 | 1/2012 | Takafuji et al. | |
| 2012/0056258 A1 | 3/2012 | Chen | |
| 2012/0129276 A1 | 5/2012 | Haensch et al. | |
| 2012/0129301 A1 | 5/2012 | Or-Bach et al. | |
| 2012/0152322 A1 | 6/2012 | Kribus et al. | |
| 2012/0171108 A1 | 7/2012 | Kim et al. | |
| 2012/0181508 A1 | 7/2012 | Chang et al. | |
| 2012/0187486 A1* | 7/2012 | Goto et al. | 257/347 |
| 2012/0193621 A1 | 8/2012 | Or-Bach et al. | |
| 2012/0195136 A1 | 8/2012 | Yoko | |
| 2012/0217479 A1* | 8/2012 | Chang et al. | 257/24 |
| 2012/0280231 A1 | 11/2012 | Ito et al. | |
| 2012/0286822 A1 | 11/2012 | Madurawe | |
| 2012/0304142 A1 | 11/2012 | Morimoto et al. | |
| 2012/0305893 A1 | 12/2012 | Colinge | |
| 2012/0313227 A1* | 12/2012 | Or-Bach et al. | 257/659 |
| 2013/0026539 A1 | 1/2013 | Tang et al. | |
| 2013/0026608 A1 | 1/2013 | Radu | |
| 2013/0105897 A1* | 5/2013 | Bangsaruntip et al. | 257/351 |
| 2013/0148402 A1 | 6/2013 | Chang et al. | |
| 2013/0240828 A1* | 9/2013 | Ota et al. | 257/9 |
| 2013/0299771 A1* | 11/2013 | Youn et al. | 257/9 |
| 2014/0008606 A1* | 1/2014 | Hussain et al. | 257/9 |
| 2014/0035041 A1 | 2/2014 | Pillarisetty et al. | |
| 2014/0085959 A1 | 3/2014 | Saraswat et al. | |
| 2014/0097868 A1 | 4/2014 | Ngai | |
| 2014/0225218 A1 | 8/2014 | Du | |
| 2014/0225235 A1 | 8/2014 | Du | |
| 2014/0269022 A1 | 9/2014 | Xie et al. | |
| 2015/0132922 A1 | 5/2015 | Du | |

FOREIGN PATENT DOCUMENTS

| | | |
|---|---|---|
| FR | 2973938 A1 | 10/2012 |
| JP | H06204810 A | 7/1994 |
| JP | 2001160612 A | 6/2001 |
| KR | 20010109790 A | 12/2001 |
| KR | 20080038535 A | 5/2008 |

(56) References Cited

FOREIGN PATENT DOCUMENTS

| WO | 2011112300 A1 | 9/2011 |
|---|---|---|
| WO | 2012113898 A1 | 8/2012 |
| WO | 2013045985 A1 | 4/2013 |

OTHER PUBLICATIONS

Co-pending U.S. Appl. No. 13/792,384, filed Mar. 11, 2013.
Co-pending U.S. Appl. No. 13/792,486, filed Mar. 11, 2013.
Co-pending U.S. Appl. No. 13/792,592, filed Mar. 11, 2013.
Fujio I. et al., "Level Conversion for Dual-Supply Systems", IEEE Transactions on Very Large Scale Integration (VLSI) Systems, vol. 12, No. 2, Feb. 2004, pp. 185-195.
Mototsugu H. et al., "A Top-Down Low Power Design Technique Using Clustered Voltage Scaling with Variable Supply-Voltage Scheme", IEEE 1998 Custom Integrated Circuits Conference, pp. 495-498.
Arunachalam V., et al., "Low-power clock distribution in microprocessor", Proceedings of the 18th ACM Great Lakes Symposium on VLSI , GLSVLSI '08, Jan. 1, 2008, 3 pages, XP055106715, New York, USA DOI: 10.1145/1366110.1366212 ISBN: 978-1-59-593999-9 p. 429-p. 434.
Donno M., et al., "Power-aware clock tree planning", Proceedings of the 2004 International Symposium on Physical Design, ISPD '04, Jan. 1, 2004, 5 pages, XP055106989, New York, New York, USA DOI: 10.1145/981066.981097 ISBN: 978-1-58-113817-7 p. 140-p. 144.
Ganguly S., et al., "Clock distribution design and verification for PowerPC microprocessors", Computer-Aided Design, 1997, Digest of Technical Papers., 1997 IEEE/AC M International Conference on San Jose, CA, USA Nov. 9-13, 1997, Los Alamitos, CA, USA, IEEE Comput. Soc, US, Nov. 5, 1995, pp. 58-61, XP032372227, DOI: 10.1109/ICCAD.1995.479991 ISBN: 978-0-8186-8200-1 p. 58-p. 61.
Tsao C.W.A., et al., "UST/DME: a clock tree router for general skew constraints", Computer Aided Design, 2000, ICCAD-2000, IEEE/ACM International Conference On, IEEE, Nov. 5, 2000, pp. 400-405, XP032402965, DOI: 10.1109/ICCAD.2000.896505 ISBN: 978-0-7803-6445-5 p. 400-p. 401.
Xie J., et al., "CPDI: Cross-power-domain interface circuit design in monolithic 3D technology", Quality Electronic Design (ISQED), 2013 14th International Symposium On, IEEE, Mar. 4, 2013, pp. 442-447, XP032418452, DOI: 10.1109/ISQED.2013.6523649 ISBN: 978-1-4673-4951-2 Section II. "Monolithic 3D Technology"; figures 1,3.
Gong., et al., "Three Dimensional System Integration", Springer, IC Stacking Process and Design, Jan. 2011; IS8N 978-1-4419-0962-6; pp. 1-246.
Cong J. et al., "An automated design flow for 3d microarchitecture evaluation", Design Automation, 2006. Asia and South Pacific Conference on Jan. 24, 2006, Piscataway, NJ, USA, IEEE, Jan. 24, 2006, pp. 384-389, XP010899545, DOI: 10.1109/ASPDAC.2006.1594713, ISBN: 978-0-7803-9451-3, the whole document.
Freidman, E. G., "Clock Distribution Networks in Synchronous Digital Integrated Circuits", 2001, IEEE, Proceedings of the IEEE, vol. 89, No. 5, pp. 665-692.
International Search Report and Written Opinion—PCT/US2014/020941—ISA/EPO—Jun. 20, 2014.
Jain A. et al., "Thermala electrical co-optimisation of floorplanning of three-dimensional integrated circuits under manufacturing and physical design constraints", IET Computers and Digital Techniques,, vol. 5, No. 3, May 9, 2011, pp. 169-178, XP006037867, ISSN: 1751-861X, DOI:10.1049/1ET-CDT:20090107, pp. 170-172.
Khan Q.A., et al., "A Single Supply Level Shifter for Multi-Voltage Systems," IEEE Proceedings of the 19t h International Conference on VLSI Design (VLSID'06), 2006, 4 pages.
Kim, T-Y., et al., "Clock Tree Syntheis for TSV-Based 3d IC designs", Oct. 2011, ACM, ACM Transactions on Design Automation of Electronic Systems, vol. 16, No. 4m Article 48, pp. 48:1-48:21.
Kulkarni J., et al., "Capacitive-Coupling Wordline Boosting with Self-Induced VCC Collapse for Write VMIN Reduction in 22-nm 8T SRAM," IEEE International Solid-State Circuits Conference, 2012, pp. 234-236.
Lin, C-T., et al., "CAD reference flow for 3d Via-Last Integrated Circuits", 2010, IEEE, pp. 187-192.
Lin S., et al., A New Family of Sequential Elements with Built-in Soft Error Tolerance for Dual-VDD Systems, IEEE Transactions on Very Large Scale Integration (VLSI) Systems, 2008, vol. 16 (10), pp. 1372-1384.
Loh, Gabriel H. et al., "Processor design in 3D die-stacking technologies," IEEE 2007 p. 31-48.
Minz J. et al., "Block-level 3-D Global Routing With an Application to 3-D Packaging", IEEE Transactions on Computer-Aided Design of Integrated Circuits and Systems, vol. 25, No. 10, Oct. 1, 2006, pp. 2248-2257, XP055137904, ISSN: 0278-0070,DOI:10.1109/TCAD.2005.860952 p. 2249-p. 2252.
Minz J. et al., "Channel and Pin Assignment for Three Dimensional Packaging Routing", May 24, 2004, pp. 1-6, XP055138056, Georgia Tech. Library. CERCS; GIT-CERCS-04-21, Retrieved from the Internet: URL:http://www.ceres.gatech.edu/tech-reports/tr2004/git-cercs-04-21.pdf.
Bobba S., et al., "Performance Analysis of 3-D Monolithic Integrated Circuits", 2010 IEEE International 3D Systems Integration Conference (3DIC), Nov. 1, 2010, pp. 1-4, XP55165273, DOI: 10.1109/3DIC.2010.5751465,ISBN: 978-1-45-770526-7.

\* cited by examiner

MONOLITHIC THREE DIMENSIONAL INTEGRATION OF SEMICONDUCTOR INTEGRATED CIRCUITS

FIELD OF DISCLOSURE

The invention relates to microelectronic fabrication, and in particular relates to monolithic three-dimensional integration of semiconductor devices.

BACKGROUND

There has been a dramatic increase in the functionality and performance of integrated circuits (IC) over the past forty years, largely due to scaling, where component sizes within ICs have been reduced (scaled) with each successive technology generation. With scaling, transistor performance and density typically improve but the wires (interconnects) that connect together the transistors degrade performance. Wires often dominate performance, functionality, and power consumption of ICs.

Sequential 3D (three-dimensional) integration of semiconductor chips (dice) is one avenue in tackling wire performance. By arranging transistors in three dimensions instead of two, one can place IC transistors closer to each other. This reduces wire length and reduces signal delay. However, there are many barriers to the practical implementation of 3D integrated chips. One such barrier is that transistor construction in ICs typically requires high temperatures (higher than about 700° C.), while wiring levels are constructed at low temperatures (lower than about 450° C.). Copper or Aluminum wiring levels may be damaged when exposed to temperatures higher than about 500° C. As such, 3D integrated IC fabrication poses several challenges.

SUMMARY

Embodiments of the invention are directed to systems and methods for three-dimensional integration of semiconductor integrated circuits.

In an embodiment, a method includes implanting ions into a first semiconductor wafer to facilitate thermal cleavage, and oxide bonding the first semiconductor wafer to a second semiconductor wafer. The first semiconductor wafer is heated to a temperature equal to or less than 450° C. to cause thermal cleavage so as to leave a portion of the first semiconductor wafer oxide bonded to the second semiconductor wafer. Sources and drains for a plurality of nanowire transistors in the portion of the first semiconductor wafer oxide bonded to the second semiconductor wafer are formed by doping in-situ during epitaxial growth at temperatures equal to or less than 450° C.

In another embodiment, an apparatus includes a silicon substrate; and a top tier oxide bonded to the silicon substrate, the top tier comprising a plurality of nanowire transistors, wherein each nanowire transistor in the plurality of nanowire transistors comprises a source, a drain, and a channel having a doping concentration less than that of the source and the drain.

In another embodiment, an apparatus includes a silicon substrate; a bottom tier formed on the silicon substrate, the bottom tier comprising a plurality of transistors; a top tier oxide bonded to the bottom tier, the top tier comprising a plurality of nanowire transistors, wherein each nanowire transistor in the plurality of nanowire transistors comprises a source, a drain, and a channel having a doping concentration less than that of the source and the drain; and a means for connecting, the means for connecting to connect at least one transistor in the plurality of transistors in the bottom tier to at least one nanowire transistor in the plurality of nanowire transistors in the top tier.

In another embodiment, a method includes a means for implanting ions, the means for implanting ions to facilitate a thermal cleavage in a first semiconductor wafer; a means for bonding, the means for bonding to oxide bond the first semiconductor wafer to a second semiconductor wafer, the second semiconductor wafer comprising a bottom tier of transistors; a means for heating, the means for heating to heat the first semiconductor wafer to a temperature equal to or less than 450° C. to cause thermal cleavage so as to leave a portion of the first semiconductor wafer oxide bonded to the bottom tier; and a means for doping, the means for doping to dope in-situ during epitaxial growth at temperatures equal to or less than 450° C. to form sources and drains for a plurality of nanowire transistors in the portion of the first semiconductor wafer oxide bonded to the bottom tier.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that specific circuits (e.g., application specific integrated circuits (ASICs)), one or more processors executing program instructions, or a combination of both, may perform the various actions described herein. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Embodiments comprise one or more top active layers of nanowire transistors formed adjacent to a bottom layer of active CMOS (Complimentary Metal Oxide Semiconductor) devices. A top layer may be referred to as a top tier, and the bottom layer may be referred to as a bottom tier. In the final assembly, the bottom layer or tier is adjacent to the wafer substrate upon which it is formed, and is closest to the wafer substrate in relation to the top layers or tiers.

Figure 1:
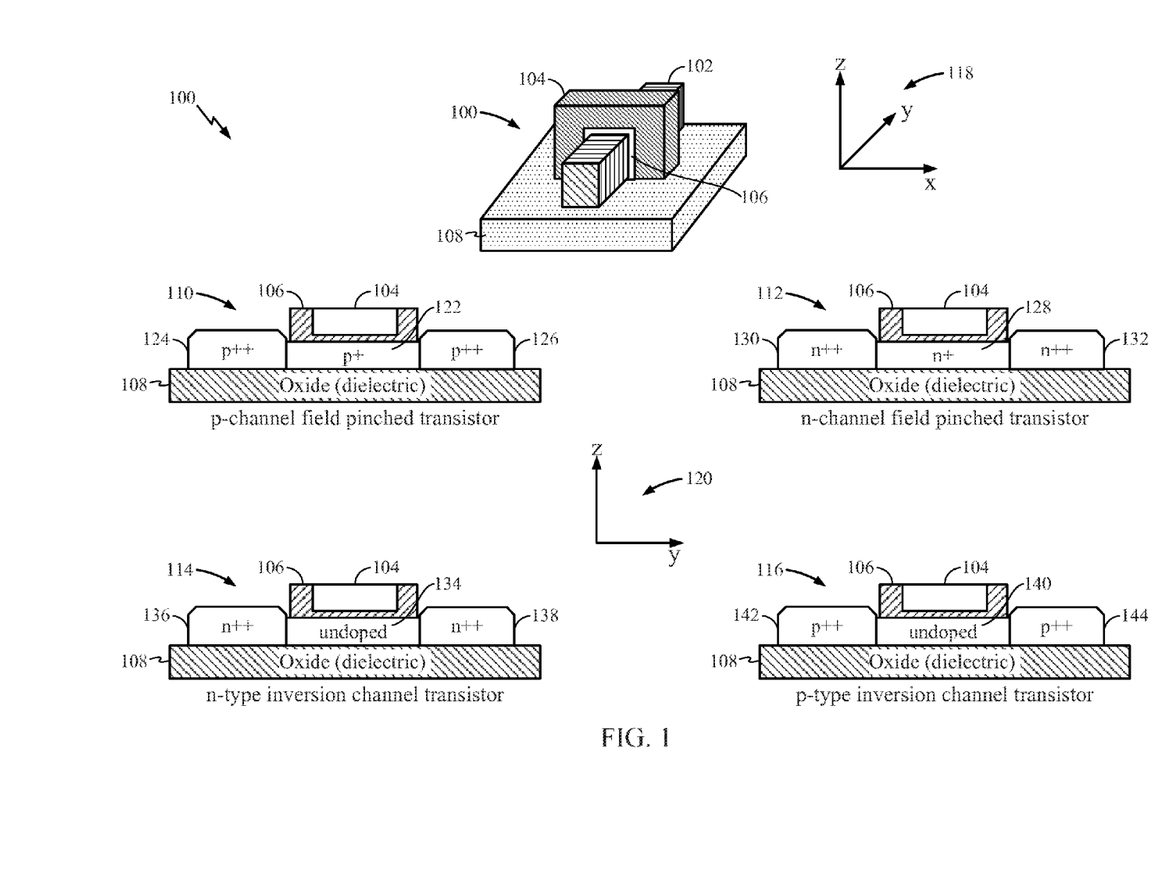
FIG. 1 illustrates various types of nanowire transistors according to an embodiment.

A nanowire transistor is a junction-less transistor. Referring to FIG. 1, a simplified perspective 100 is illustrated comprising a source-channel-drain region 102, a gate 104, and a dielectric 106 disposed between the gate 104 and the source-channel-drain region 102. The dielectric 106 may be a High-K dielectric. The structure is shown integrated on a dielectric film 108. Depending upon how the source-channel-drain region 102 is doped, various types of nanowire transistors may be realized: a p-channel field pinched nanowire transistor 110, an n-channel field pinched nanowire transistor 112, an n-type inversion channel nanowire transistor 114, and a p-type inversion channel nanowire transistor 116. The semiconductor material for each of these nanowire transistors may be Silicon (Si), and the gates may be metal or polysilicon.

The view indicated by the nanowire transistors 110, 112, 114, and 116 is a simplified cross-sectional view of the nanowire transistor 100. The relationship among these views is indicated by noting that the coordinate system 118 refers to the orientation of the nanowire transistor 100, and the coordinate system 120 refers to the orientation of the nanowire transistors 110, 112, 114, and 116, so that the view of the latter nanowire transistors represents a slice in the y-z plane of the nanowire transistor 100.

The nanowire transistors 110 and 112 operate in the accumulation mode, and the nanowire transistors 114 and 116 operate in the inversion mode. The channel 122 of the nanowire transistor 110 is a lightly doped (p+) p-type semiconductor, where a typical doping concentration may be about $10^{18}$ cm$^{-3}$. Other embodiments may have different doping concentrations, for example, doping concentrations that are less than $10^{18}$ cm$^{-3}$. The source and drain regions 124 and 126 are highly doped (p++) p-type, where a typical doping concentration may be about $10^{20}$ cm$^{-3}$. Other embodiments may have different doping concentrations, for example, doping concentrations that are greater than $10^{20}$ cm$^{-3}$. The channel 128 of the nanowire transistor 112 is lightly doped (n+) n-type, where a typical doping concentration may be about $10^{18}$ cm$^{-3}$. Other embodiments may have different doping concentrations, for example, doping concentrations that are less than $10^{18}$ cm$^{-3}$. The source and drain regions 130 and 132 are highly doped (n++) n-type, where a typical doping concentration may be about $10^{20}$ cm$^{-3}$. Other embodiments may have different doping concentrations, for example, doping concentrations that are greater than $10^{20}$ cm$^{-3}$.

The channel 134 of nanowire transistor 114 is undoped (neutral, or zero donor concentration); and the source and drain regions 136 and 138 are highly doped (n++) n-type, where a typical doping concentration may be about $10^{20}$ cm$^{-3}$. Other embodiments may have different doping concentrations, for example, doping concentrations that are greater than $10^{20}$ cm$^{-3}$. The channel 140 of nanowire transistor 116 is undoped; and the source and drain regions 142 and 144 are highly doped (p++) p-type, where a typical doping concentration may be about $10^{20}$ cm$^{-3}$. Other embodiments may have different doping concentrations, for example, doping concentrations that are greater than $10^{20}$ cm$^{-3}$.

The physics underlying nanowire transistors has been an active area of research, and their operation need not be discussed in detail here to understand and practice the disclosed embodiments.

Figure 2A:
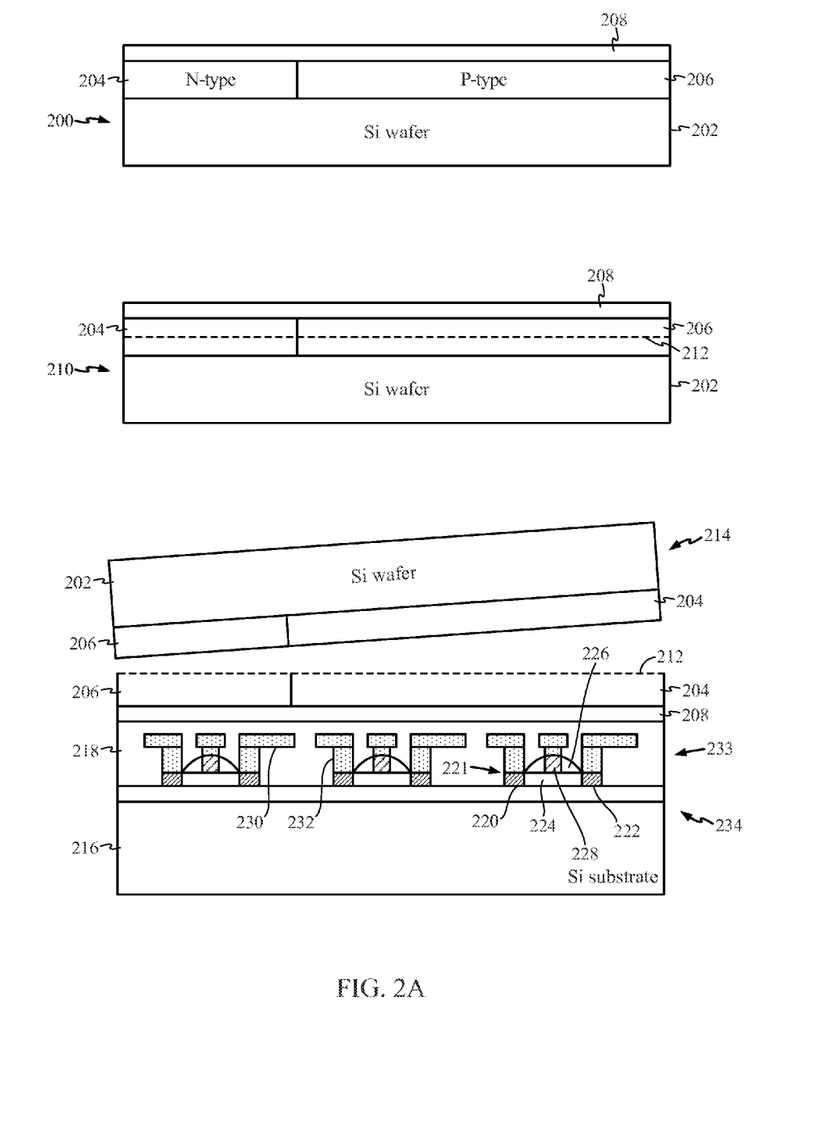
FIGS. 2A and 2B illustrate various structures and steps in a process flow according to an embodiment.
Figure 2B:
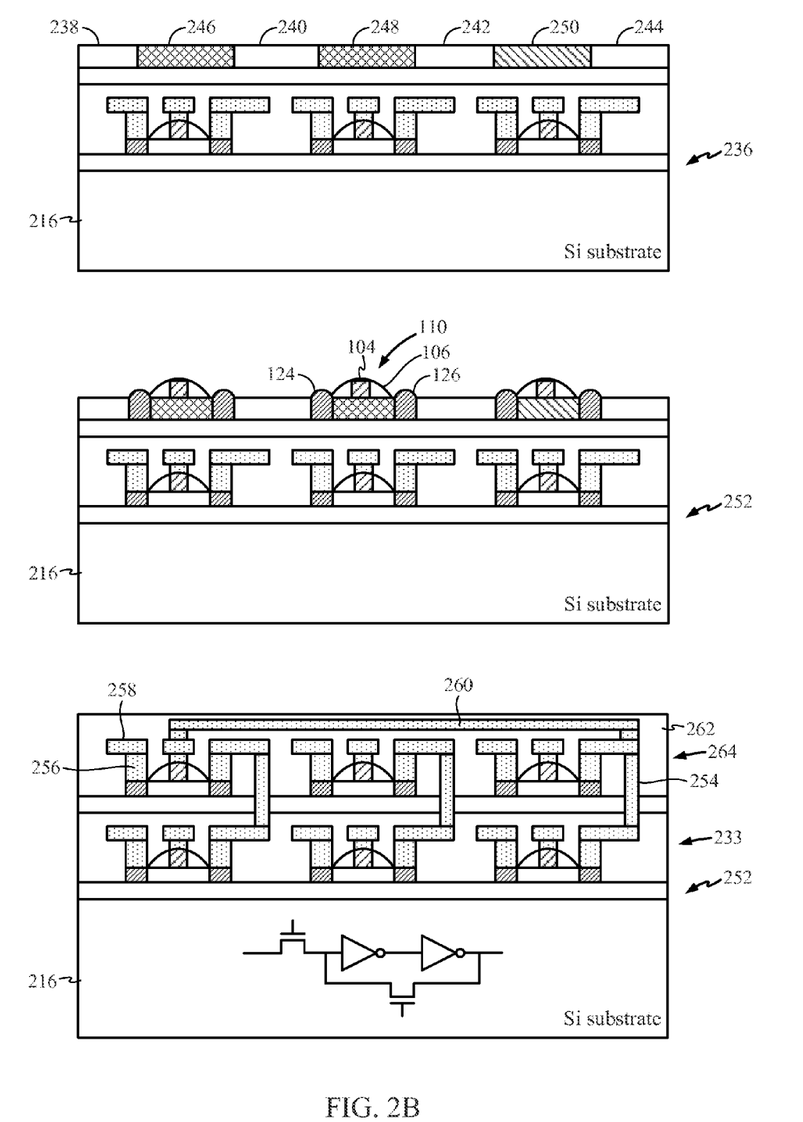

FIGS. 2A and 2B represent a process flow according to an embodiment. In step 200, a silicon wafer 202 is doped by the method of masked ion-implantation to form an active layer (top tier) comprising various n-type and p-type regions. For ease of illustration, only two such regions are illustrated in FIG. 2A: the n-type region 204 and the p-type region 206. Dielectric deposition or oxidation forms a thin oxide layer 208 above the active layer. A high-temperature, thermal activation anneal is performed at about 1000° C.

The active layer comprising the n-type region 204 and the p-type region 206 will form part of the top tier 264 (see FIG. 2B) in the final 3D integrated circuit. More precisely, a portion of the active layer comprising the regions 204 and 206 will form part of the top tier 264, as will be described later. The n-type region 204 and p-type region 206 are lightly doped, for example at a donor concentration of about $10^{18}$ cm$^{-3}$. These regions will form the channels for the nanowire transistors in the top tier 264, as well as part of the sources and drains for these nanowire transistors.

In step 210, ion implantation is performed to define a cleavage interface 212. The interface 212 is within the active region comprising the regions 204 and 208. For some embodiments, the ions may be Hydrogen ions.

In step 214, the wafer 202 is flipped and oxide bonded to the wafer 216. The oxide bonding is performed at a relatively low temperature, for example at a temperature equal to or less than 400° C. For ease of illustration, Step 214 does not actually show the wafer 202 bonded to the wafer 216, but in the bonding procedure, the oxide layer 208 in the wafer 202 is bonded to an oxide layer 218 in the wafer 216. The wafer 216 serves as the substrate for the final 3D integrated circuit, and therefore will be referred to as the substrate 216.

Formed in the wafer 216 is a CMOS active layer comprising pMOSFET (Metal-Oxide-Semiconductor-Field-Effect-Transistor) and nMOSFET devices, with a metal layer and vias making various electrical connections to the sources, drains, and gates of these CMOS devices. For example, three CMOS devices are shown formed on the substrate 216, where for example one of the CMOS devices 221 comprises source and drain regions 220 and 222, a channel 224, a gate 228, and a dielectric 226 disposed between the gate 228 and the channel 224. Other features of the CMOS integrated circuit formed on the substrate 216 are one or metal layers, for example the metal layer 230, and vias connecting the device terminals to the one or metal layers, for example the via 232. The CMOS active layer on the substrate 216 is the bottom tier 233 in the final 3D integrated circuit.

In arriving at the step 234, the bonded wafers are heated to a relatively low temperature, for example equal to or less than 300° C., so that the wafers may be separated at the cleavage interface 212. When the portion of the wafer 202 above the cleavage interface 212 is removed, a thin film (the "portion" referred to previously) of the active layer comprising regions 204 and 206 that was formed on the wafer 202 now remains bonded to the oxide 208 on the substrate 216.

In step 236 of FIG. 2B, oxide isolation trenches are formed in the top tier active layer. For example, the four oxide isolation trenches 238, 240, 242, and 244 are illustrated in step 236. As a result, the portion of the p-type region 206 remaining on the substrate 216 after thermal cleavage has been isolated into the p-type region 246 and the p-type region 248; and the portion of the remaining n-type region 204 has been isolated into the n-type region 250.

Because the portion of the active region originally formed on the wafer 202 and bonded to the oxide layer 208 is very thin, it is substantially transparent, and therefore it is practical to use optical alignment when aligning various masks used to form the oxide trenches illustrated in step 236, as well as the features formed in the remaining steps in the fabrication of the top tier.

After CMP (Chemical Mechanical Polishing) planarization, in step 252 gate dielectric and electrode deposition is performed, followed by gate definition and spacer formation. In-situ doping during epitaxial growth is performed for selective source and drain formation, at a temperature equal to or less than 450° C. For example, in step 252 the p-channel field pinched nanowire transistor 110 is shown, with the source and drain regions 124 and 126, the gate 104, and the gate dielectric 106.

Step 252 includes various fabrication steps to finish the 3D integration, such as forming inter-tier vias, for example the inter-tier via 254; forming vias to the sources, drains, and gates of the nanowire transistors, for example the via 256; and one or more metal layers to form interconnects, for example the metal layers 258 and 260. Also formed is the oxide layer 262 encapsulating the metal layers and the nanowire transistors. The oxide layer 262 may also serve as a bonding surface for additional top tier layers, where the previously described steps are repeated.

For some embodiments, step 200 is modified where the active layer in the wafer 202 that is to be part of the top tier in the final integrated circuit is undoped, or comprises various undoped regions. This leads to nanowire transistors that operate in the inversion mode, such as the nanowire transistors 114 and 116 as described with respect to FIG. 1.

Figure 3:
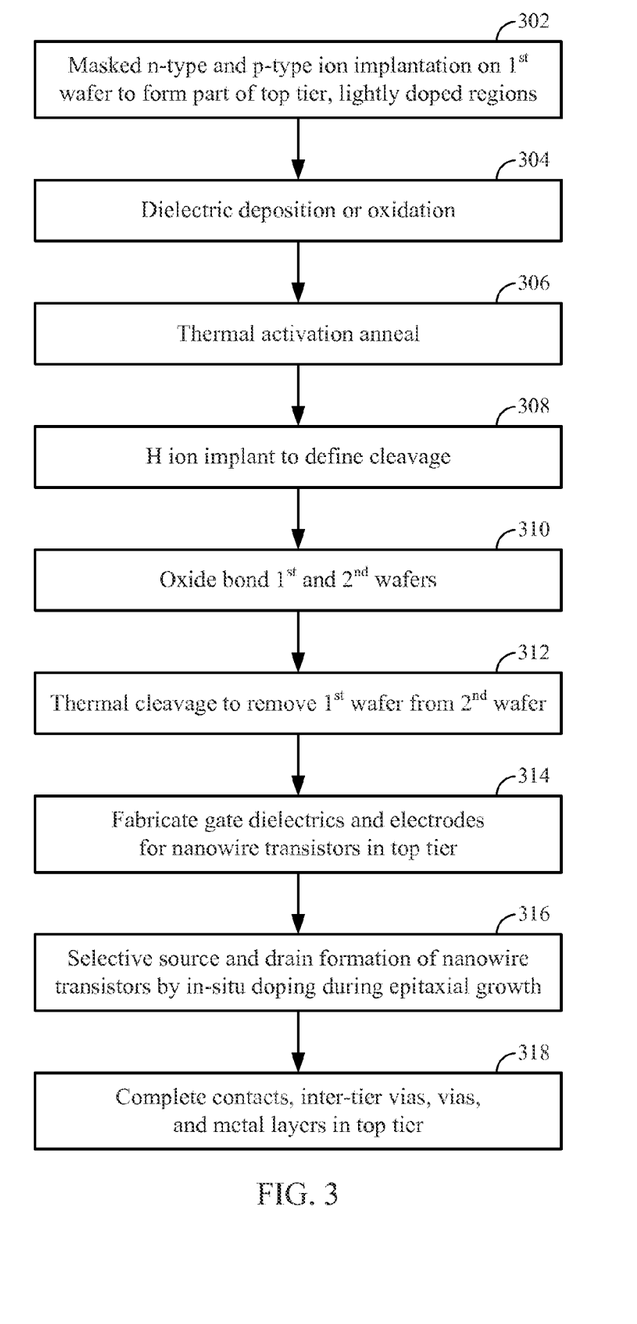
FIG. 3 illustrates various steps in a process flow according to an embodiment.

FIG. 3 outlines the process flow described above. Masked n-type and p-type ion implantation is performed on a first wafer to form n-type and p-type regions as part of the active layer in the top tier (302). The n-type and p-type regions are lightly doped, and will be used to form sources, drains, and channels for the nanowire transistors. For some embodiments, there is no doping so that step 302 is not performed, or for some embodiments, some regions are undoped and other regions are lightly doped.

A dielectric or oxidation layer is formed over the active region (304), and a thermal activation and anneal (306) is performed at a high temperature to repair crystal damage due to the ion implantation. Hydrogen ion implantation is performed to define a cleavage interface (308), and the first wafer is oxide bonded to a second wafer at a low temperature.

As discussed previously, the second wafer already has formed thereon an integrated CMOS circuit, where the CMOS active layer will be the bottom tier 233 of the 3D integrated circuit. The second wafer serves as a substrate for the 3D integrated circuit. The cleavage interface is thermally activated so that most of the first wafer material can be removed from the second wafer (312), leaving behind on the bottom tier 233 a thin active layer comprising a portion of the previously formed n-type and p-type regions that will make up the sources, drains, and channels of the nanowire transistors in the top tier.

Gate dielectrics and electrodes for the top tier nanowire transistors are fabricated (314). Low temperature in-situ doping during epitaxial growth (316) is used to form the sources and drains for the top tier nanowire transistors. The contacts, intra-tier vias, inter-tier vias, and various metal layers in the top tier are completed and are encapsulated by an oxide layer (318).

Figure 4:
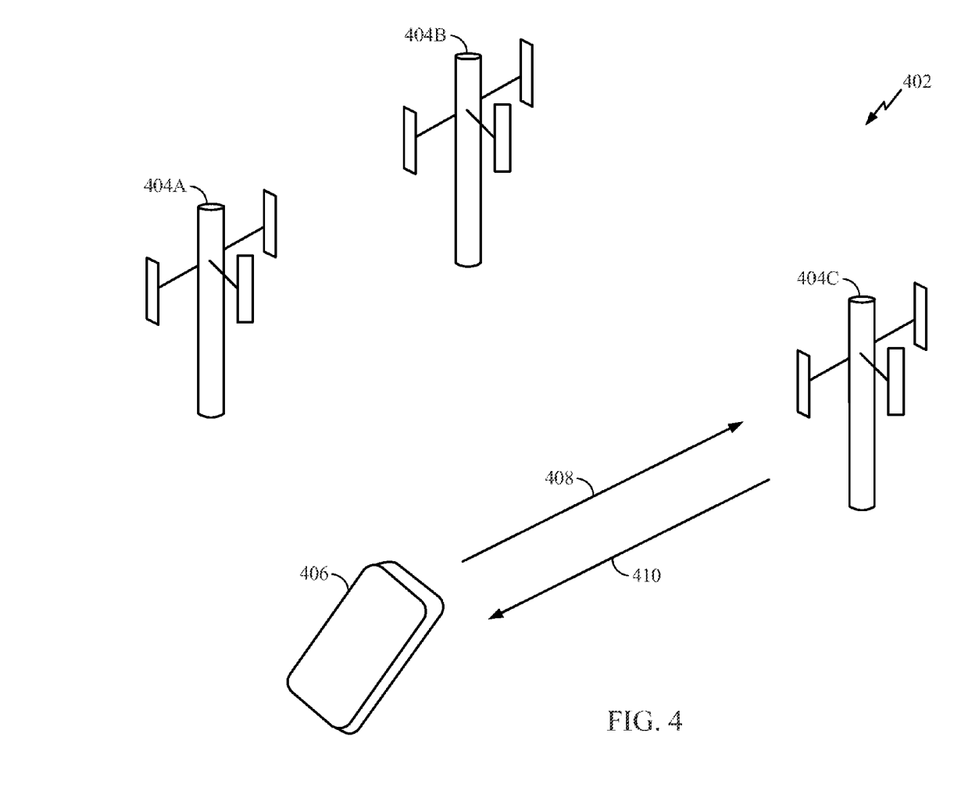
FIG. 4 illustrates a wireless communication system in which embodiments may find application.

FIG. 4 illustrates a wireless communication system in which embodiments may find application. FIG. 4 illustrates a wireless communication network 402 comprising base stations 404A, 404B, and 404C. FIG. 4 shows a communication device, labeled 406, which may be a mobile cellular communication device such as a so-called smart phone, a tablet, or some other kind of communication device suitable for a cellular phone network. The communication device 406 need not be mobile. In the particular example of FIG. 4, the communication device 406 is located within the cell associated with the base station 404C. Arrows 408 and 410 pictorially represent the uplink channel and the downlink channel, respectively, by which the communication device 406 communicates with the base station 404C.

Embodiments may be used in data processing systems associated with the communication device 406, or with the base station 404C, or both, for example. FIG. 4 illustrates only one application among many in which the embodiments described herein may be employed.

Structures made according to the described embodiments are expected to provide for 1) packing and connecting transistors in three dimension circuits without TSV (Through Silicon Via) area penalty or increased interconnect signal delay; 2) reducing average metal interconnect layers for each transistor tier, thereby reducing total interconnect RC delay (which is difficult to achieve with conventional TSV methods); 3) mitigating problems with wafer (die) bonding alignment, thereby allowing very accurate, high density via connections through the various tiers (semiconductor layers); 4) enabling many core distributed memory architectures that utilize thousands or even millions of vias (which cannot readily be achieved by conventional TSV wide I/O approaches); 5) three dimensional ICs and architectures with high performance elementary devices in each layer; and 6) reducing transistor integration cost by cutting down on metal layer usage, lowering defect density, increasing yield, and lowering testing cost.

Embodiments have been described in which the bottom tier layer comprises CMOS devices. However, embodiments are not limited to a top tier of nanowire transistors formed over a bottom tier of CMOS devices. The bottom tier may comprise other types of transistors, such as for example bipolar devices. Furthermore, for some embodiments there need not be a bottom tier of devices, but rather, the nanowire transistors may be oxide bonded to a substrate, where the oxide used for bonding serves as an insulator.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for sequential integration of transistors and IC components layer by layer over a single substrate within state of the art microfabrication environment. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus comprising:
   a silicon substrate;
   a bottom tier on the silicon substrate, the bottom tier comprising a plurality of transistors wherein each transistor in the plurality of transistors in the bottom tier comprises a source, a drain and a gate, and wherein the silicon substrate has at least one bottom tier via connected to at least one of the source, drain and gate of at least one of the transistors in the bottom tier;
   a thin oxide layer on the bottom tier, the thin oxide layer having at least one inter-tier via; and
   a top tier on the thin oxide layer, the top tier comprising a plurality of nanowire transistors, wherein each nanowire transistor in the plurality of nanowire transistors comprises a source, a drain, a gate and a channel, wherein the top tier has at least one top tier via connected to at least one of the source, drain and gate of at least one of the nanowire transistors in the top tier, and wherein the channel has a doping concentration equal to $10^{18}$ cm$^{-3}$ and less than that of the source and the drain; and
   at least one interconnect comprising said at least one bottom tier via, said at least one top tier via and said at least one inter-tier via to connect the source or the drain of the at least one of the transistors in the bottom tier to the source or drain of the at least one of the nanowire transistors in the top tier and the gate of at least another one of the nanowire transistors in the top tier.

2. The apparatus of claim 1, wherein the source and drain for each nanowire transistor in the plurality of nanowire transistors is formed by in-situ doping during epitaxial growth at a temperature equal to or less than 450° C.

3. The apparatus of claim 1, wherein the source and drain for each nanowire transistor in the plurality of nanowire transistors have a doping concentration equal to or greater than $10^{20}$ cm$^{-3}$.

4. The apparatus of claim 1, wherein the plurality of transistors comprises pMOSFETs (p-Metal-Oxide-Semiconductor-Field-Effect-Transistor) and nMOSFETs.

* * * * *